United States Patent

Cho

[11] Patent Number: 5,541,141
[45] Date of Patent: Jul. 30, 1996

[54] METHOD FOR FORMING AN OXYNITRIDE FILM IN A SEMICONDUCTOR DEVICE

[75] Inventor: Byung J. Cho, Kyungki-Do, Rep. of Korea

[73] Assignee: Hyundai Electronics Industries Co., Ltd., Kyungki-Do, Rep. of Korea

[21] Appl. No.: 394,607

[22] Filed: Feb. 27, 1995

[51] Int. Cl.$^6$ .................. H01L 21/318; H01L 21/316
[52] U.S. Cl. ........................................................ 437/239
[58] Field of Search ............................ 437/241, 242, 437/239

[56] References Cited

U.S. PATENT DOCUMENTS

| | | | |
|---|---|---|---|
| 3,422,321 | 1/1969 | Tombs | 437/241 |
| 4,363,868 | 12/1982 | Takasaki et al. | 430/314 |
| 4,438,157 | 3/1984 | Romano-Moran | 427/93 |
| 4,532,022 | 7/1985 | Takasaki et al. | 204/192 D |
| 4,543,707 | 10/1985 | Ito et al. | 29/578 |
| 4,581,622 | 4/1986 | Takasaki et al. | 357/23.5 |
| 4,960,727 | 10/1990 | Mattox et al. | 437/67 |
| 5,264,396 | 11/1993 | Thakur et al. | 437/238 |
| 5,296,411 | 3/1994 | Gardner et al. | 437/238 |
| 5,338,954 | 8/1994 | Shimoji | 257/326 |
| 5,397,720 | 3/1995 | Kwong et al. | 437/40 |
| 5,403,786 | 4/1995 | Hori | 437/238 |

Primary Examiner—R. Bruce Breneman
Assistant Examiner—Matthew L. Whipple
Attorney, Agent, or Firm—Fish & Richardson

[57] ABSTRACT

A method for forming an oxide film in a semiconductor device comprises a pre-oxidation process, a main oxidation process and a post-oxidation process. $N_2O$ gas is used for the pre-oxidation process, a mixed gas of $N_2O$ gas and $NH_3$ gas is used for the main oxidation process, and $N_2O$ gas is used for the post-oxidation process. The insulation characteristics of the oxide film are increased by introducing nitrogen, and amount of introduced nitrogen can be regulated by the controlling of amount of $NH_3$ gas. Also, the problems encountered when $NH_3$ gas and $N_2O$ gas are used separately for the oxidation process can be solved by using of the mixed gas of $NH_3$ gas and $N_2O$ gas.

1 Claim, 1 Drawing Sheet

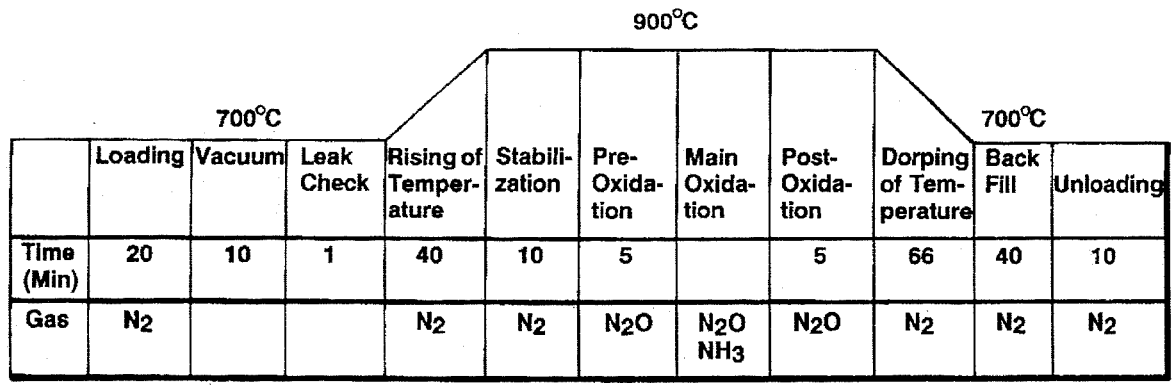

| | Loading | Vacuum | Leak Check | Rising of Temperature | Stabilization | Pre-Oxidation | Main Oxidation | Post-Oxidation | Dorping of Temperature | Back Fill | Unloading |
|---|---|---|---|---|---|---|---|---|---|---|---|
| Time (Min) | 20 | 10 | 1 | 40 | 10 | 5 | | 5 | 66 | 40 | 10 |
| Gas | N2 | | | N2 | N2 | N2O | N2O NH3 | N2O | N2 | N2 | N2 |

METHOD FOR FORMING AN OXYNITRIDE FILM IN A SEMICONDUCTOR DEVICE

BACKGROUND OF THE INVENTION

1. Field of the Invention

The present invention relates to a method for forming an oxide film in a semiconductor device, more particularly to a method for forming an oxide film, which can obtain an oxide film of good quality by growing an oxide film under environment of mixed gas of $N_2O$ gas and $NH_3$ gas during a main oxidation process and by using $N_2O$ gas during a pre-oxidation process and a post-oxidation process.

2. Information Disclosure Statement

In general, in order to enhance the reliability of oxide film in a semiconductor device, nitrogen is introduced in an oxide film. In the method for forming an oxide film using $NH_3$ gas, the long-term reliability of the oxide film is deteriorated due to hydrogen ions contained in $NH_3$ gas. There is another method for forming an oxide film using $N_2O$ gas, however, an high temperature process is required because of the high activation energy of $N_2O$ gas. Also it is impossible to control independently the oxidation rate and influx of the nitrogen. That is, $N_2O$ gas is resolved into 64.3% of $N_2$, 31.0% of $O_2$ gas and 4.7% of NO gas in the oxidation chamber under a temperature of 950 degree Celsius. The NO gas is needed to introduce nitrogen into the oxide film, however, NO gas exists in extremely small quantities of 4.7%. Also, most of the NO gas acts upon the $O_2$ gas, and $NO_2$ gas is formed according to the chemical reaction formula: ($2NO+O_2=2NO_2$). Therefore, because the influx of nitrogen depends on the degree of reaction of NO gas and $O_2$ gas, it is impossible to control independently the oxidation rate and influx of the nitrogen.

SUMMARY OF THE INVENTION

It is an object of the present invention to provide a method for forming an oxide film using $N_2O$ gas, and mixed gas of $N_2O$ gas and $NH_3$ gas, so that it is possible to control the oxidation rate and influx of the nitrogen and obtain an oxide film of good quality.

To achieve the above object, a method for forming an oxide film comprises the steps of:

a) initiating oxide film formation by introducing an NITROUS OXIDE containing gas;

b) controlling the oxidation rate and influx of nitrogen by introducing ammonia into the nitrous oxide containing gas; and c) halting the introducing of ammonia gas while maintaining the flow of nitrous oxide containing gas until formation of the oxide film is complete.

BRIEF DESCRIPTION OF THE DRAWINGS

The present invention will now be described with reference to the attached drawings, in which:

The FIGURE is a flow chart illustrating the method of oxidation according to the present invention.

A more complete understanding of the present invention can be obtained by considering the following detailed description.

DETAILED DESCRIPTION OF THE INVENTION

A method for forming an oxide film according to the present invention is described in detail conjunction with the FIGURE.

A wafer is loaded in an oxidation chamber containing $N_2$ gas at a temperature of 700 degree Celsius. Temperature in the oxidation chamber is increased to 900 degree Celsius and then stabilized. Then a pre-oxidation process, main oxidation process and post-oxidation process are executed successively in the oxidation chamber in order to form an oxide film on the surface of the wafer.

The pre-oxidation process is executed with $N_2O$ gas, the main oxidation process is performed with a mixed gas of $N_2O$ gas and $NH_3$ gas, and the post-oxidation process is done with $N_2O$ gas.

Thereafter, the temperature of interior of the oxidation chamber is dropped to 700 degree Celsius, and $N_2$ gas is supplied in the oxidation chamber. The oxidation process is completed, and the wafer is unloaded from the oxidation chamber.

In the above oxidation processes, temperature in the oxidation chamber, pressure and flow rate of process gases($N_2O$ gas and $NH_3$ gas) are varied according to the condition(thickness) of the oxide film.

As noted, prior to and after the main oxidation process using the mixed gas of $N_2O$ gas and $NH_3$ gas, the pre-oxidation and post-oxidation processes using $N_2O$ gas are performed. The post-oxidation process is undertaken so as to prevent a nitridation of the substrate of the wafer. The post-oxidation process is done to prevent penetration of any remaining $NH_3$ to the oxide film and to prevent degeneration of the interface characteristic by hydrogen.

In the main oxidation process, $NH_3$ gas is mixed with $N_2O$ gas, the proper ratio of $NH_3$ gas in the mixed gas is 0.5–20%. Because of the lower activation energy of $NH_3$ gas, the influx of nitrogen depends upon amount of $NH_3$ gas. Therefore, enough nitrogen can be introduced in the oxide film by the mixed gas of a small quantity of $NH_3$ gas and N20, and the incorporated amount of nitrogen can be controlled by a rate of $NH_3$ gas. Also, hydrogen is acted upon oxygen which is resolved into $N_2O$ gas, and then is made OH as a wet oxidizer, OH accelerates the oxidation process.

Because nitrogen is incorporated into the oxide film simultaneously with the oxidation process, it therefore is possible to obtain an oxide film of good quality.

According to the present invention as described above, the insulation characteristics of an oxide film is increased by an introducing nitrogen, the amount of nitrogen can be regulated by controlling of the amount of $NH_3$ gas. Also, the present invention can solve the problems encountered when $NH_3$ gas and $N_2O$ gas are used separately for the oxidation process, by using of the mixed gas of $NH_3$ gas and $N_2O$ gas.

What is claimed is:

1. A method for forming an oxide film in a semiconductor device comprising:

a) initiating oxide film formation by introducing an nitrous oxide containing gas;

b) controlling the oxidation rate and influx of nitrogen by introducing ammonia into said nitrous oxide containing gas; and c) halting the introducing of ammonia gas while maintaining the flow of nitrous oxide containing gas until formation of said oxide film is complete.

* * * * *